US009903541B2

(12) United States Patent
Bichler et al.

(10) Patent No.: US 9,903,541 B2
(45) Date of Patent: Feb. 27, 2018

(54) DEVICE FOR PROVIDING ELECTROMAGNETIC RADIATION

(71) Applicant: OSRAM GmbH, Munich (DE)

(72) Inventors: Daniel Bichler, Munich (DE); Tim Fiedler, Munich (DE)

(73) Assignee: OSRAM GmbH, Munich (DE)

( * ) Notice: Subject to any disclaimer, the term of this patent is extended or adjusted under 35 U.S.C. 154(b) by 479 days.

(21) Appl. No.: 14/418,088

(22) PCT Filed: Jun. 14, 2013

(86) PCT No.: PCT/EP2013/062452
§ 371 (c)(1),
(2) Date: Jan. 29, 2015

(87) PCT Pub. No.: WO2014/019758
PCT Pub. Date: Feb. 6, 2014

(65) Prior Publication Data
US 2015/0204492 A1   Jul. 23, 2015

(30) Foreign Application Priority Data

Jul. 31, 2012  (DE) .................. 10 2012 213 467

(51) Int. Cl.
*F21K 9/64*   (2016.01)
*F21K 99/00*   (2016.01)
(Continued)

(52) U.S. Cl.
CPC ............ *F21K 9/56* (2013.01); *C09K 11/0883* (2013.01); *C09K 11/7734* (2013.01); *F21K 9/64* (2016.08);
(Continued)

(58) Field of Classification Search
CPC . F21K 9/64; F21K 9/56; F21V 29/502; C09K 11/0883
(Continued)

(56) References Cited

U.S. PATENT DOCUMENTS

2008/0081011 A1*  4/2008  Oshio .................. C04B 35/597
                                              423/263
2010/0012964 A1*  1/2010  Copic .................. C04B 35/584
                                              257/98
(Continued)

FOREIGN PATENT DOCUMENTS

CN        102333844 A      1/2012
DE      202005011701 U1    9/2006
(Continued)

OTHER PUBLICATIONS

Chinese Office Action based on Application No. 201380041100.2(8 Pages and 5 pages of English translation) dated Sep. 21, 2015 (Reference Purpose Only).
(Continued)

*Primary Examiner* — Robert May
*Assistant Examiner* — Leah S Macchiarolo
(74) *Attorney, Agent, or Firm* — Viering, Jentschura & Partner mbB

(57) ABSTRACT

Various embodiments may relate to a device for providing electromagnetic radiation, including a radiation assembly for generating excitation radiation, and at least one conversion element for generating conversion radiation, which has at least one first phosphor and which is arranged at a distance to the radiation assembly in a beam path of the excitation radiation. As the first phosphor, a nitridosilicate of the type M2Si5N8:D is used, wherein D= activator and wherein M is
(Continued)

selected from the group barium, strontium, calcium alone or in combination, wherein the mean grain size d50 of the phosphor is at least 10 μm.

18 Claims, 10 Drawing Sheets

(51) Int. Cl.

| | | |
|---|---|---|
| *C09K 11/08* | (2006.01) | |
| *C09K 11/77* | (2006.01) | |
| *F21S 8/10* | (2006.01) | |
| *F21V 29/502* | (2015.01) | |
| *F21V 9/16* | (2006.01) | |
| *F21V 14/08* | (2006.01) | |
| *G02B 26/00* | (2006.01) | |
| *H01S 5/00* | (2006.01) | |
| *F21Y 115/30* | (2016.01) | |
| *F21Y 115/10* | (2016.01) | |

(52) U.S. Cl.
CPC .............. *F21S 48/1145* (2013.01); *F21V 9/16* (2013.01); *F21V 14/08* (2013.01); *F21V 29/502* (2015.01); *G02B 26/008* (2013.01); *F21Y 2115/10* (2016.08); *F21Y 2115/30* (2016.08); *H01S 5/005* (2013.01)

(58) Field of Classification Search
USPC ................................ 362/84; 257/E33.061, 98
See application file for complete search history.

(56) References Cited

U.S. PATENT DOCUMENTS

| | | | |
|---|---|---|---|
| 2011/0116253 A1* | 5/2011 | Sugiyama ............. | F21S 10/007 362/84 |
| 2011/0149549 A1* | 6/2011 | Miyake .................... | F21V 7/22 362/84 |
| 2011/0304261 A1 | 12/2011 | Winkler et al. | |

FOREIGN PATENT DOCUMENTS

| | | |
|---|---|---|
| DE | 102006016548 A1 | 10/2006 |
| DE | 102009010705 A1 | 9/2010 |
| WO | 2009117148 A2 | 9/2009 |
| WO | 2010097157 A1 | 9/2010 |
| WO | 2011149156 A1 | 12/2011 |

OTHER PUBLICATIONS

International Search Report for PCT/EP2013/056192 dated Jun. 10, 2013 and Written Opinion, 10 pages (For information purpose only).

Office Action for DE 10 2012 213 467.0 dated Jun. 21, 2013 issued in parallel German application, 4 pages (For information purpose only).

Hyewon Chae et al., "Synthesis of SrCaSi5N8:Eu2+ by Carbothermal. Reaction Method", Abstract #2359, 218th ECS Meeting, 2010, 1 page, Journal of The Electrochemical Society, The Electrochemical Society.

Piau et al. "Synthesis of Nitridosilicate CaSr1-xEuxSi5N8 (x=0-1) Phosphor by Calcium Cyanamide Reduction for White Light-Emitting Diode Applications" 2008, 6 pages, vol. 155, The Electrochemical Society.

* cited by examiner

DEVICE FOR PROVIDING ELECTROMAGNETIC RADIATION

RELATED APPLICATIONS

The present application is a national stage entry according to 35 U.S.C. § 371 of PCT application No.: PCT/EP2013/062452 filed on Jun. 14, 2013, which claims priority from German application No.: 10 2012 213 467.0 filed on Jul. 31, 2012, and is incorporated herein by reference in its entirety.

TECHNICAL FIELD

Various embodiments may relate to a device for providing electromagnetic radiation. The device has a radiation assembly for generating excitation radiation and at least one conversion element for generating conversion radiation. The conversion element has phosphors and is arranged at a distance to the radiation assembly in a beam path of the excitation radiation.

BACKGROUND

Currently, radiation sources which are energy-efficient, high-intensity, and/or provide a high power density, such as high-power LEDs (light-emitting diode), lasers, for example, in the form of laser diodes, and/or superluminescent diodes are increasingly being used in modern illumination units. In contrast to incandescent bulbs, which are thermal radiators, these radiation sources emit light in a narrowly limited spectral range, so that the light thereof is nearly monochromatic or exactly monochromatic. One possibility for opening up further spectral ranges is, for example, radiation conversion, in which phosphors are irradiated by means of LEDs and/or laser diodes and in turn emit radiation of another wavelength. In so-called "remote phosphor" applications, for example, a phosphor-containing layer located at a distance from a radiation source is typically lighted by means of LEDs or laser diodes and in turn emits radiation of another wavelength. For example, this technology can be used in order to convert the light of blue LEDs by admixing yellow light, which is generated by exciting a phosphor-containing layer, into white light.

Furthermore, projectors are regularly currently used to optically display data. Such a projector projects the data to be displayed in the form of individual stationary and/or moving images on a projection screen, for example. Generating the required excitation radiation with the aid of a conventional discharge lamp, i.e., an ultra high pressure mercury vapor lamp, for example, is known in the case of a conventional projector. More recently, however, LARP (laser activated remote phosphor) technology has also already been used. In this technology, a conversion element arranged spaced apart from the radiation source, which has phosphor or consists thereof, is irradiated using excitation radiation, in particular an excitation beam (pump beam, pump laser beam). The excitation radiation of the excitation beam is entirely or partially absorbed by the phosphor and converted into a conversion radiation (emission radiation), the wavelengths and therefore spectral properties and/or color of which are determined by the conversion properties of the phosphor. In the case of down conversion, the excitation radiation of the radiation source is converted by the irradiated phosphor into conversion radiation having longer wavelengths than those of the excitation radiation. For example, with the aid of the conversion element, blue excitation radiation (blue laser light) can thus be converted into red or green conversion radiation (conversion light, illumination light).

The excitation radiation can introduce a large amount of energy into the conversion element, whereby it can heat up strongly. This can result in damage to the conversion element and/or the phosphors contained therein, which can be provided as a single phosphor or a phosphor mixture. In addition, in the event of a lack of cooling of the phosphor, conversion losses arise as a result of efficiency reduction caused by thermal quenching. To avoid excessively strong heating and to avoid the possible damage linked thereto to the conversion element or the phosphor, arranging multiple conversion elements on a phosphor wheel (often also referred to as a pump wheel or color wheel), which is irradiated using the excitation beam while it rotates, is known. Because of the rotation, different conversion elements and/or regions of the conversion elements are successively illuminated and therefore the introduced light energy is distributed over the surface area.

Heretofore, a degree of miniaturization in LARP technology has been conceptually restricted, since the assembly which has the radiation source (pump laser) and the phosphor wheel requires a large amount of installation space. However, a smaller installation space is desirable for different applications, for example, in the field of pico-projection, i.e., in the case of small-dimensioned mobile projectors, and/or of miniaturized projection units in so-called embedded projection, in which the projection unit is integrated in a mobile telephone or a camera, for example. The thermal attachment of the conversion element is important in this case to avoid overheating and damage.

For remote phosphor applications, thin phosphor layers such as cubic silicate minerals, orthosilicates, garnets, or nitrides are applied to surfaces of corresponding carriers. The phosphor layers are normally mechanically fixed using binding agents on a carrier and attached to an optical system (lenses, collimators, etc.), wherein the light coupling can occur via air or by means of an immersion medium, for example. To ensure the most optimal possible optical connection of the optical system to the phosphor and avoid light losses, the most direct possible optical connection should be ensured. For remote phosphor applications, i.e., applications in which phosphor and radiation source, for example, high-power laser diodes, are spatially separated, for example, a thin phosphor layer is applied to a surface, for example, a substrate and/or a carrier, mechanically fixed using binding agents, and attached (air, immersion, etc.) to an optical system (lenses, collimators, etc.).

In the above-mentioned applications, the phosphors are excited to emission as is typical by means of LEDs and/or laser diodes using high light powers. The thermal losses arising in this case are to be dissipated, via the carrier, for example, to avoid overheating and therefore thermally-related changes of the optical properties or also the destruction of the phosphor. The phosphors are excited to emission, for example, using light sources of high power density (several $W/mm^2$). The high thermal losses (Stokes) arising in this case result in an introduction of heat into the phosphor layer. If these temperatures become excessively high, for example, due to inadequate heat dissipation, thermally-related changes of the optical properties (emission wavelength, conversion efficiency, etc.) can occur, or finally the phosphors or the layer itself can be destroyed. Both phosphor and also binding agent can be the cause of this degeneration of the phosphor layer. For this reason, the phosphor layer is to be designed so that it can have optimum heat dissipation, to avoid the thermal destruction of the phosphors and the binding agent.

The phosphors, which are usually provided in powder form, do not form mechanically stable layers, i.e., abrasion-resistant and/or scratch-resistant layers, without an additional use of binding agents, for example, silicones. Binding agents are also used in general, however, to bring together the phosphor particles to form a phase, which can then be applied to corresponding surfaces. If binding agents are used for the layer stabilization, however, these binders themselves can interact with the phosphors and therefore negatively influence their optical and thermal properties, and also their service life. In addition, the thermal conductivity of the binding agents frequently represents a limiting variable in the dissipation of heat arising in the conversion element. Moreover, the binding agents are themselves to be thermally and spectrally stable and are to display little to no aging properties. For this reason, the use of an inert, optically transparent, thermally and spectrally stable binding agent is advantageous for the production of stable and longer-lived phosphor layers.

Using silicones as binder matrices for a light-technology excitation (for example, LEDs) is known. However, these do not permit excessively high light powers (power densities of several $W/mm^2$) or make further technological expenditure necessary (for example, color wheels to reduce the light action time). The known phosphor-silicone mixtures are typically applied directly to metallic substrates. For example, the phosphor is suspended in organic matrices, for example, silicone, and then screen printed, for example. The layers are approximately 30 μm thick, for example. Silicone has a poor thermal conductivity of 0.1-0.2 W/m·K, which has the result that the phosphor heats up more strongly in operation and thus becomes more inefficient. This is problematic in particular in high-performance LEDs and in laser applications.

The coating process during the formation of a phosphor layer is limited by the type of the substrate materials. Thus, high-temperature processes are not conceivable on many plastics and metallic materials (for example, aluminum) because of their melting temperatures or heat resistance. Alternatively available ceramic materials having good thermal conductivity (for example, AlN), in contrast, are linked to increased technological and financial expenditure.

Inorganic matrices having improved heat dissipation are known from various publications, for example, low-melting-point glass from WO 2011/104364 A1 or metal phosphates from WO 2011/138169 A1.

Inorganic matrices have the disadvantage in relation to organic matrices, however, that to achieve a compact, bubble-free layer, relatively high temperatures are generally needed if a specific chemical stability (for example, in relation to UV radiation and/or moisture) is required. Typical softening temperatures of common low-melting-point glasses are from 500° C. to 600° C. At these temperatures, opto-electronic substrates, for example, an LED chip or substrates having good reflection, for example, highly-reflective aluminum or the phosphor to be embedded, in particular nitrides, are already damaged and thus become less efficient.

As alternatives, conversion elements are known, which are formed from a ceramic including the phosphor or from a crystal including the phosphor. In particular, the phosphor can form the ceramic or the crystal. Such conversion elements can be glued onto cooling bodies, so that the heat arising therein can be dissipated. A limiting variable for the dissipation of the heat is in this case the thermal conductivity of the adhesive used. Furthermore, it is favorable for good heat dissipation if the conversion elements are implemented as particularly thin.

SUMMARY

In various embodiments, a device for providing electromagnetic radiation is provided, which is producible simply and/or cost-effectively and/or which enables conversion radiation to be provided using high-energy excitation radiation. Furthermore, in various embodiments, a device for providing electromagnetic radiation is provided, the conversion element of which is temperature-resistant and weather-resistant and/or has a high efficiency and/or a long service life.

In various embodiments, a device for providing electromagnetic radiation is provided. The device has a radiation assembly for generating excitation radiation and at least one conversion element for generating conversion radiation. The conversion element has a coarse-grained nitridosilicate as a single phosphor or one of multiple phosphors. The conversion element is arranged at a predefined distance to the radiation assembly in a beam path of the excitation radiation.

The conversion element and therefore the device are producible simply and/or cost-effectively. The novel phosphor allows the conversion element to be used to generate conversion radiation using high-energy excitation radiation. In other words, the radiation assembly can have one, two, or more radiation sources, which generate the excitation radiation having a high power density. Furthermore, the conversion element having the novel phosphor is particularly temperature-resistant and weather-resistant and has a high efficiency and a long service life, since improved radiation resistance, for example, UV resistance, and heat dissipation are provided by the novel phosphor, and the embedded phosphor is damaged less by environmental factors.

The conversion element can have, for example, a conversion layer, which can be implemented on a substrate, for example. With the aid of a suitable binder, such as metal phosphate, a conversion layer having particularly high adhesive strength can be produced, for example. The conversion layer can furthermore be implemented so that it does not experience mechanical damage and/or destruction during subsequent processing steps. Furthermore, the conversion layer can be produced at moderate temperatures.

In various embodiments, the conversion element is arranged movably in relation to the radiation assembly. For example, the conversion element is arranged rotatably.

In various embodiments, the device has a phosphor wheel, which is arranged rotatably about an axis and which has the conversion element. The conversion element can be arranged, for example, on an edge of the phosphor wheel and/or on a circular surface of the phosphor wheel. In addition to the conversion element, for example, one, two, or more further conversion elements can be arranged. The conversion elements can have different phosphors, for example.

In various embodiments, the conversion element is arranged fixedly in relation to the radiation assembly. For example, the device can be used for a pico-projection application without phosphor wheel, for example, in a portable electronic device, wherein the use of a suitable matrix, for example, a condensed metal phosphate, as the matrix for the conversion element can contribute to sufficient heat dissipation.

In various embodiments, a surface of the conversion element has a cooling structure. The cooling structure has an artificially enlarged surface of the conversion element. This can contribute to good cooling of the conversion element.

In various embodiments, the cooling structure has channels and/or ribs. This can contribute to effectively implementing the cooling structure in a simple manner.

In various embodiments, the radiation assembly has at least one radiation source, which generates the excitation radiation having a high luminance.

In various embodiments, the radiation source is a laser, a laser diode, or a superluminescent diode.

In various embodiments, the high luminance is in the range between 1 W/mm$^2$ and 50 W/mm$^2$.

Extremely radiation-stable and temperature-stable phosphors are required for converting blue light from laser diodes in particular. For projection applications, to span an acceptable color space, in addition to green-emitting and yellow-emitting phosphors, red-emitting phosphors are also necessary, which emit at wavelengths of $\lambda_{dom}$ ~600 nm with high efficiency and at the same time are stable in the final product in spite of the thermal and optical stress.

In previous projection modules, various red phosphors were used: low-doped MAlSiN$_3$:Eu$^{2+}$-based phosphors and high-doped M$_2$Si$_5$N$_8$:Eu$^{2+}$-phosphors (europium content≥4% in relation to M (M is one or more of the elements calcium, strontium, and barium)).

Phosphors of the class MAlSiN$_3$:Eu$^2$ are used in several products on the market (CASIO, Intematix). Because of the high dominance wavelength of the phosphors used, however, these systems only have a small optical useful effect. Modification of the phosphor does enable shifting the emission in favor of a better visual useful effect, but only at the cost of the stability (M is normally calcium, however, it can partially be substituted by strontium, for example, which does reduce the stability, but also shifts the dominance wavelength).

Upon the use of highly-doped nitridosilicates M$_2$Si$_5$N$_8$:Eu$^{2+}$, the visual useful effect is significantly greater as a result of the location of the emission spectrum, but these systems have little efficiency and display high thermal quenching behavior under the strong optical stress.

All heretofore studied, low-doped nitridosilicates M$_2$Si$_5$N$_8$:Eu$^{2+}$, which are significantly more efficient because of advantageous thermal quenching behavior, emit at excessively short wavelengths for the application (for example, $\lambda_{dom}$=595 nm at 30 W optical for Ca$_{0.1}$Sr$_{0.9}$BaSi$_5$N$_8$: 4% Eu$^{2+}$ or are not stable in relation to the optical and thermal stress (for example, fine-grained CaSrSi$_5$N$_8$—see figures).

The novel low-doped nitridosilicates (Eu$^{2+}$ content≤2% in relation to M, preferably at least 0.1 mol-% of the composition M$_2$Si$_5$N$_8$:Eu$^{2+}$ (M is one or more of the elements calcium, strontium, and barium) have significantly larger primary grains having mean grain sizes of d$_{50}$≥10 μm, measured by means of static laser diffraction, than the significantly finer, baked primary grains of classic low-doped 258 systems (d$_{50}$ typically approximately 5 μm or less). Preferably, d$_{50}$ is greater than or equal to 21 μm. These novel phosphors display, for a Eu$^{2+}$ content ≤2%, improved stability and, for Eu$^{2+}$ contents ≤1%, even substantially improved stability and much less thermal quenching behavior than fine-grained phosphors of this composition.

These coarse-grained, low-doped phosphors are stable in relation to optical and thermal stress upon the excitation using a laser. Therefore, they are ideally suitable for the application in laser-based conversion elements.

Coarse-grained samples of Ca$_{(1-x)}$Sr$_x$Si$_5$N$_8$:Eu$^{2+}$ are all stable and suitable for the application in laser-based conversion elements. Their emission wavelength may be established via the precise composition (calcium-strontium) and the activator concentration.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the appended drawings, which form a part of this description and in which specific embodiments, in which the disclosure can be implemented, are shown for illustration. In this regard, direction terminology such as "top", "bottom", "forward", "back", "front", "rear", etc. is used with reference to the orientation of the described figure(s). Since components of embodiments can be positioned in a number of different orientations, the direction terminology is used for illustration and is in no way restrictive. It is obvious that other embodiments can be used and structural or logical changes can be performed without deviating from the scope of protection of the present disclosure. It is obvious that the features of the different embodiments described herein can be combined with one another, if not specifically indicated otherwise. The following detailed description is therefore not to be interpreted in a restrictive sense, and the scope of protection of the present disclosure is defined by the appended claims.

In the scope of this description, the terms "connected", "attached", and also "coupled" are used to describe both a direct and also an indirect connection, a direct or indirect attachment, and also a direct or indirect coupling. In the figures, identical or similar components are provided with identical reference signs, insofar as this is expedient.

A component which emits electromagnetic radiation can, in various embodiments, be a semiconductor component which emits electromagnetic radiation and/or can be implemented as a diode which emits electromagnetic radiation, as an organic diode which emits electromagnetic radiation, as a transistor which emits electromagnetic radiation, or as an organic transistor which emits electromagnetic radiation.

The electromagnetic radiation can be, for example, light in the visible range, UV light, and/or infrared light. In this context, the component which emits electromagnetic radiation can be implemented, for example, as a light-emitting diode (LED), as an organic light-emitting diode (OLED), as a light-emitting transistor, or as an organic light-emitting transistor. The light-emitting component can be part of an integrated circuit in various embodiments. Furthermore, a plurality of light-emitting components can be provided, for example, housed in a shared housing.

Figure 1:
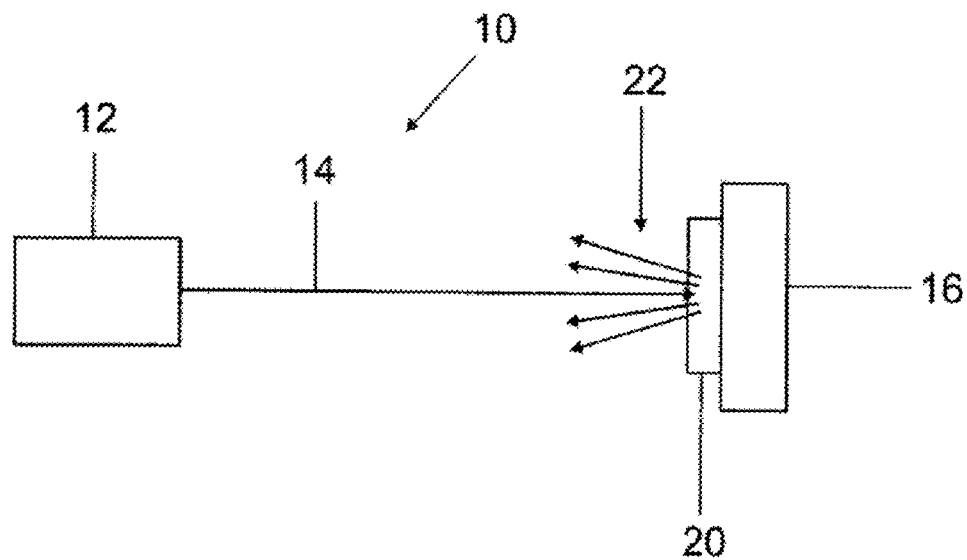
FIG. 1 shows an embodiment of a device for providing electromagnetic radiation.

FIG. 1 shows a device 10 for providing electromagnetic radiation according to various embodiments. The device 10 has a radiation assembly 12, which generates excitation radiation 14. The radiation assembly 12 is a radiation source or has one, two, or more radiation sources, for example. For example, a component which emits electromagnetic radiation is used as the radiation source. The radiation source 12 can be a laser radiation source, for example. The laser radiation source can be a laser diode, for example. The laser diode can be a single-mode or multimode laser diode. For example, the laser diode can be a laser diode which emits blue laser light, and which is also referred to as a blue laser diode. A power of the radiation source 12 can be 50 mW to 5 W, for example. Alternatively to the blue laser diode, the emission wavelengths of which can lie in the spectral range from 400 nm to 480 nm, for example, a UV (laser) radiation source can be used as the radiation source 12, for example, having an emission wavelength between 300 nm and 400 nm.

The excitation radiation 14 is, for example, electromagnetic radiation in the visible range. The excitation radiation (pump light or pump radiation) 14 can also be, for example, ultraviolet radiation, infrared radiation, or even corpuscular radiation, for example, an electron beam or ion beam, but the excitation radiation 14 is preferably laser radiation and/or LED light. The excitation radiation 14 is not necessarily limited to a specific spectral range; for example, pumping can be performed in the red, green, blue, and/or ultraviolet spectral range, for example, by a corresponding radiation source (pump radiation source) or also a combination of multiple radiation sources in the radiation assembly 12. In general, the radiation sources can be designed for the purpose of being operated using essentially constant power or also being pulsed, for example. The excitation radiation 14 is oriented onto a conversion element 20 fastened on a carrier 16. In other words, the radiation assembly 12 illuminates or irradiates the conversion element 20 and/or the conversion element 20 is arranged in a beam path of the excitation radiation 14. The carrier 16 can also be referred to as a substrate. Furthermore, the conversion element 20 can be applied to a substrate, which can then be fastened on the carrier 16. The radiation assembly 12 has a predefined distance, which is greater than zero, to the conversion element and is therefore not in direct physical contact with the conversion element 20. The carrier 16 can be, for example, a part of a color wheel and/or, for example, a part of a projector. The device 10 can be arranged in the projector, for example. Alternatively thereto, the device 10 can be arranged, for example, in a motor vehicle, for example, as internal lighting, headlight, or taillight, in a portable electronic device, for example, a portable projector and/or a mobile telephone, or in an endoscope. Furthermore, the carrier 16 can have a cooling device.

The irradiated conversion element 20 in turn emits conversion radiation 22. Alternatively, the device 10 can have multiple radiation assemblies 12 and/or multiple conversion elements 20. The excitation radiation 14 and/or the conversion radiation 22 can also be referred to as electromagnetic radiation. The conversion element 20 has a phosphor or phosphors to generate the conversion radiation 22. The phosphors are energetically excited with the aid of the deflected excitation beam 14. During the following energetic quenching, the phosphors emit the conversion radiation of one or more predefined wavelengths. Therefore, a conversion of the excitation radiation 14 occurs, whereby the conversion radiation 22 is generated. During the conversion, the wavelengths of the excitation radiation 14 are shifted to shorter or longer wavelengths. The colors can be single colors or mixed colors. The single colors can have green, red, or yellow light, for example, and/or the mixed colors can be mixed, for example, from green, red, and/or yellow light and/or can have white light, for example. In addition, blue light can be provided, for example, in that the conversion element 20 is implemented so that at least partially non-converted excitation radiation 14 leaves the device 10 as usable electromagnetic radiation. The single colors or mixed colors can be displayed with the aid of the conversion radiation 22 and/or the excitation radiation 14. For example, green, red, and yellow can be displayed with the aid of blue laser light. If the UV laser light is used as pump light, the phosphors can also be selected so that they display red, green, blue, and yellow.

The conversion element 20 optionally has a matrix material (binding agent), which has a condensed metal phosphate, for example. The phosphor or the phosphors is/are embedded in the matrix material. A phosphor can be understood as a material which converts electromagnetic radiation of one wavelength into electromagnetic radiation of another (longer) wavelength in a manner subject to loss, for example, by means of phosphorescence or fluorescence. The energy difference of absorbed electromagnetic radiation and emitted electromagnetic radiation can be converted into phonons, i.e., heat, and/or by means of emission of electromagnetic radiation having a wavelength proportional to the energy difference.

Typical known phosphors which can be used with the novel red-omitting phosphor are, for example, garnets or nitrides, silicates, oxides, phosphates, borates, oxynitrides, sulfides, selenides, aluminates, tungstates, and halides of aluminum, silicon, magnesium, calcium, barium, strontium, zinc, cadmium, manganese, indium, tungsten, and other transition metals, or rare earth metals such as yttrium, gadolinium, or lanthanum, which are doped with an activator, for example, copper, silver, aluminum, manganese, zinc, tin, lead, cerium, terbium, titanium, antimony, or europium. In various embodiments, the additional phosphor is an oxidic or (oxy)nitridic phosphor, such as a garnet, orthosilicate, nitrido-(alumino)-silicate, nitride, or nitrido-orthosilicate, or a halogenide or halophosphate. Specific examples of suitable phosphors are strontium chloroapatite:Eu ((Sr,Ca)$_5$(PO$_4$)$_3$Cl:Eu; SCAP), yttrium-aluminum garnet:Cer (YAG: Ce), CaAlSiN$_3$:Eu, or green-emitting garnet A3B5O12:Eu, A is preferably yttrium or lutetium alone or in combination, B is preferably aluminum or gallium alone or in combination. Furthermore, particles having light-scattering properties and/or auxiliary substances can be contained in the phosphor mixture, for example. Examples of temporary auxiliary substances include surfactants and organic solvents. Examples of permanent additives are light-scattering particles, for example, metal oxide particles or stabilizers, for example, oxidic nanoparticles.

The matrix material optionally has a condensed metal phosphate, for example, a condensed aluminum phosphate, for example, made of a mono-aluminum phosphate solution.

The matrix material is, for example, amorphous or predominantly amorphous, colorless, and/or transparent to the excitation radiation 14 and/or the conversion radiation 22. The condensed metal phosphate has good thermal conductivity, which is higher than that of silicone, and good UV resistance. The condensed metal phosphate is, for example, lead-free or low-lead, for example, having a proportion less than 1 mol-%. The condensed metal phosphate is generally low-alkali and/or low-halogen, for example, alkali-free or halogen-free. The concentrations of alkali metals and halogens can therefore be negligible and/or can be less than 1 mol-% in each case. This means, for example, that these elements are not intentionally added and originate at most from contaminants of the precursor materials used. A higher moisture stability is thus achieved. One exception is the combination of metal phosphate with alkali silicate.

The thermal coefficient of expansion of the conversion layer having the matrix made of metal phosphate and having the phosphor and/or optionally having additives can be, for example, greater than $5.0 \times 10^{-6}$ $K^{-1}$.

The substrate to which the phosphor layer is applied can be, for example, the carrier 16, the phosphor wheel, a cooling body, or an optical component, for example, a collimator. The substrate can consist of various suitable materials, for example, plastic, glass, ceramic, or metal. Molds made of the mentioned materials can be used to implement a phosphor body. The phosphor body can be a phosphor film, for example. The phosphor layer, the phosphor film, and/or the phosphor body, for example, a phosphor plate, can then form the conversion element 20 or can be part of the conversion element 20.

Figure 2:
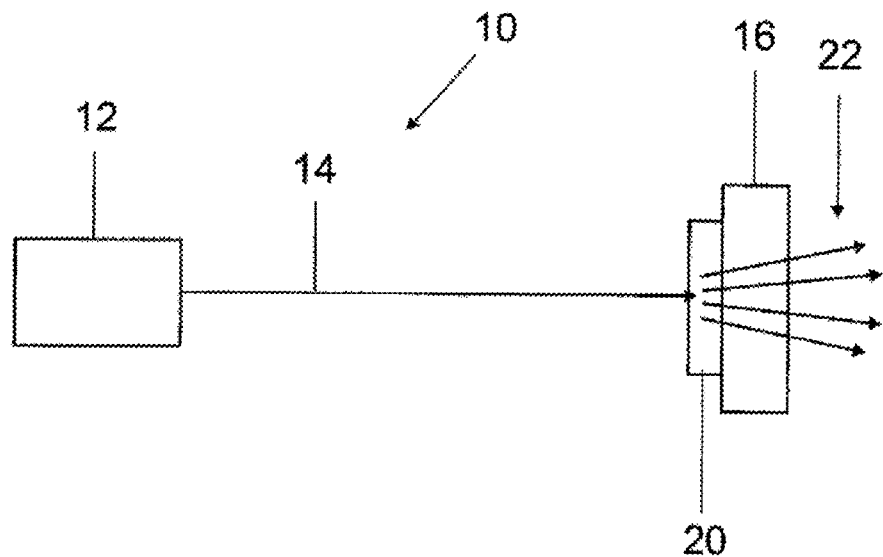
FIG. 2 shows an embodiment of a device for providing electromagnetic radiation.

FIG. 2 shows an embodiment of the device 10, which substantially corresponds to the embodiment shown in FIG. 1, wherein in contrast thereto, in the embodiment of the device 10 shown in FIG. 2, the carrier 16 is implemented as at least partially transparent to the conversion radiation 22 and/or the excitation radiation 14.

Figure 3:
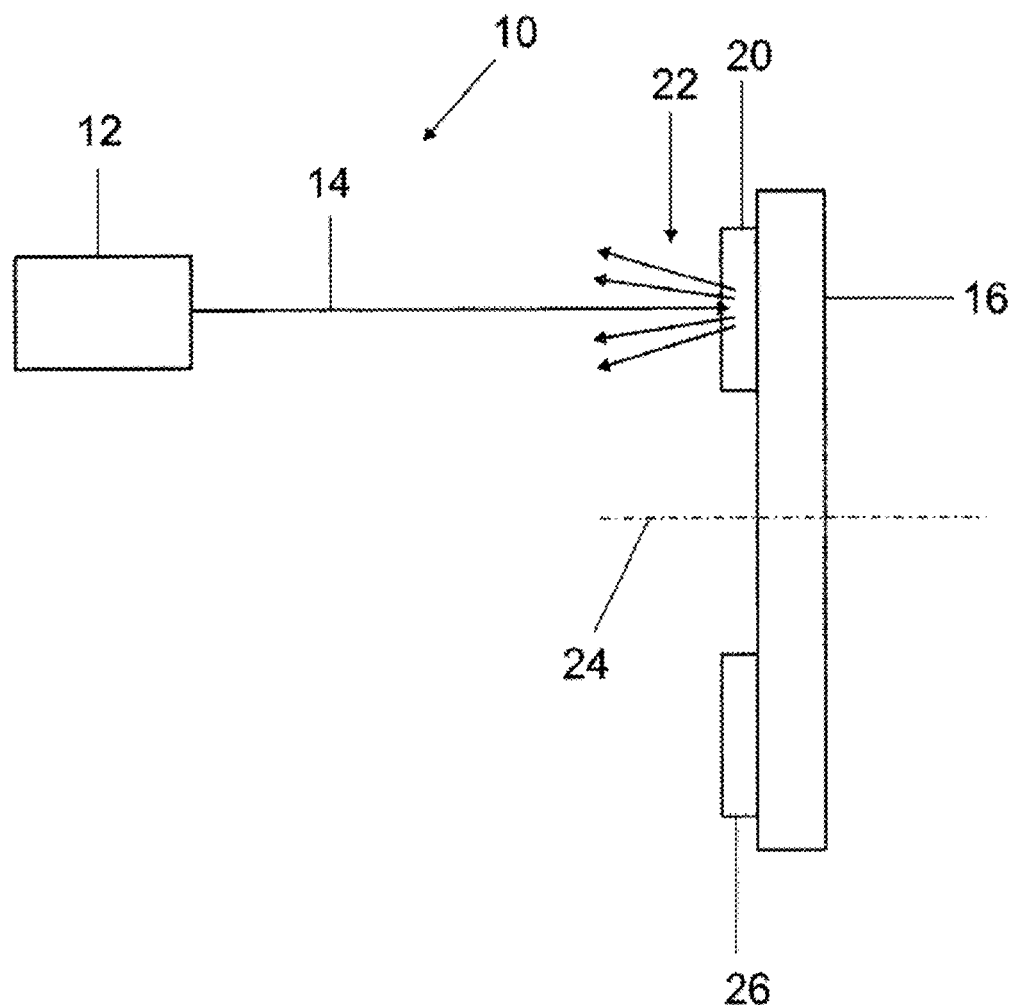
FIG. 3 shows an embodiment of a device for providing electromagnetic radiation.
Figure 4:
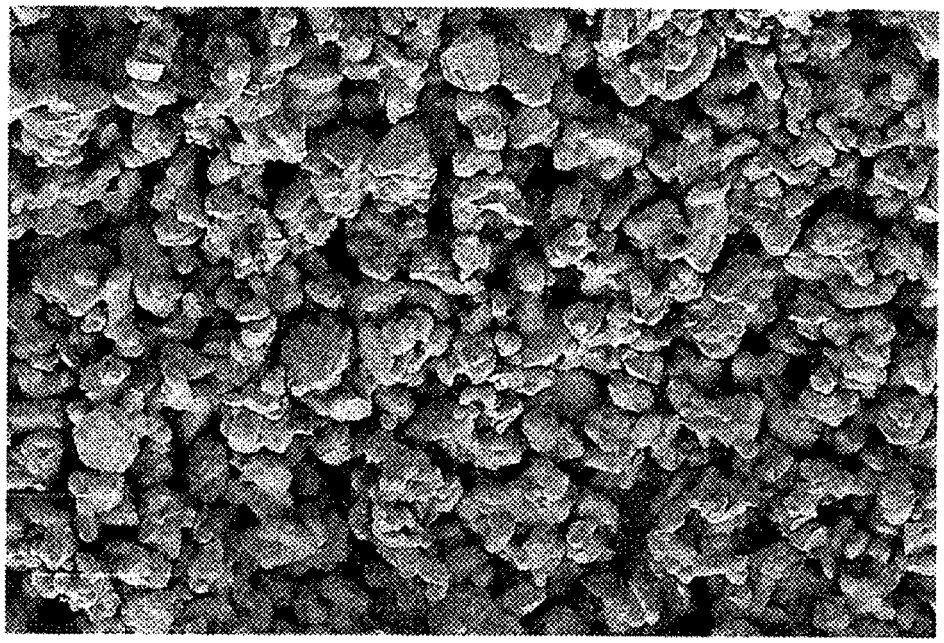
FIGS. 4-7 show SEM pictures of various phosphors.

FIG. 3 shows an embodiment of the device 10, which substantially corresponds to the embodiment shown in FIG. 1, wherein in contrast thereto, in the embodiment of the device 10 shown in FIG. 3, the carrier 16 is implemented as a phosphor wheel. The phosphor wheel is mounted rotatably about an axis 24. The phosphor wheel can be rotated about the axis 24 with the aid of a drive unit (not shown). A further conversion element 26 is optionally arranged on the phosphor wheel. Furthermore, still further conversion elements can be arranged on the phosphor wheel. The conversion elements 20, 26 can have identical and/or different phosphors, so that with the aid thereof, conversion radiation 22 of identical or different wavelengths can be generated.

Figure 5:
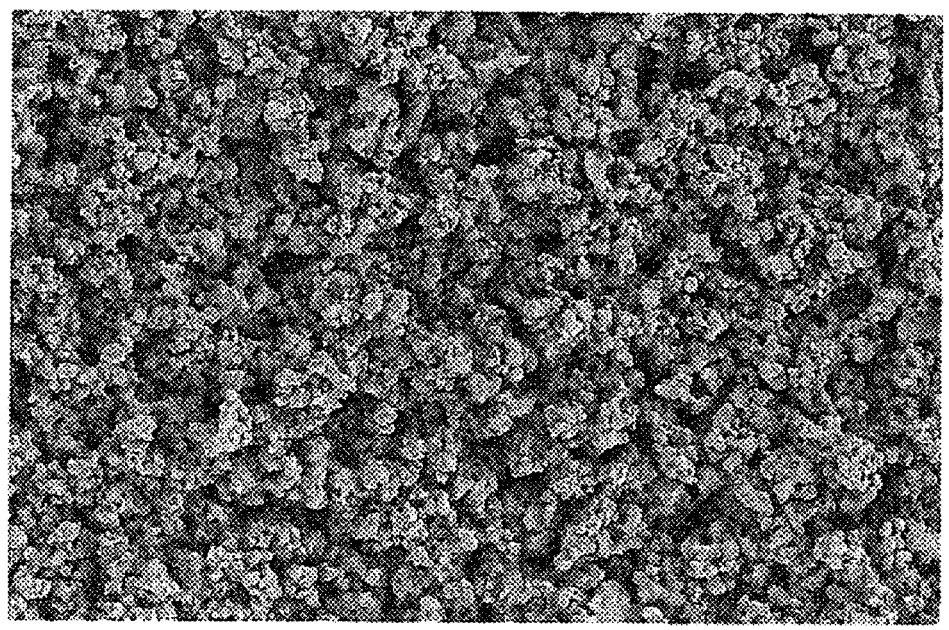
Figure 6:
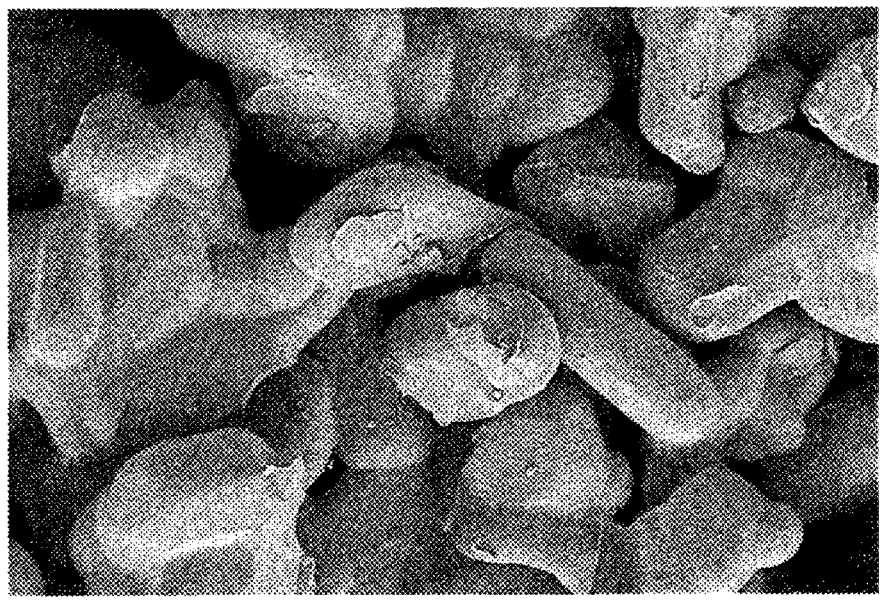
Figure 7:
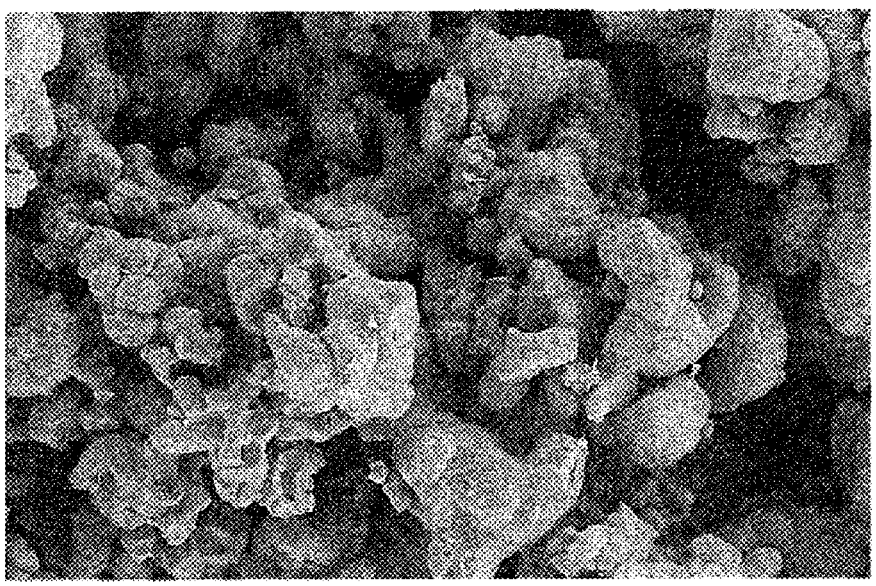

FIG. 4 to FIG. 7 show SEM pictures of phosphor samples in 500× enlargement (FIGS. 4 and 5) and in 3000× enlargement (FIGS. 6 and 7). In this case, FIGS. 4 and 6 each show the same phosphor of the type M2Si5N8:Eu with low doping of europium (1 mol-% europium) having large primary grain ($d_{50}$=22 μm). FIGS. 5 and 7 each show the similar phosphor M2Si5N8:Eu with higher doping of europium (4 mol-%) having small primary grain ($d_{50}$=5 μm).

A specific embodiment 1 of the present disclosure is the phosphor $CaSrSi_5N_8$: 1% europium having a mean grain size of $d_{50}$=22 μm, which is excited using blue laser diodes ($\lambda \approx 445$ nm). It emits optically at $\lambda_{dom} \approx 599$ nm upon excitation using 45 W and is stable under the specified conditions.

A further embodiment 2 of the present disclosure is the phosphor $CaSrSi_5N_8$: 0.5% europium having a mean grain size of $d_{50}$=20 μm, which is excited using blue laser diodes ($\lambda \approx 445$ nm). It emits optically at $\lambda_{dom} \approx 598$ nm upon excitation using 45 W and is stable under the specified conditions.

A comparative embodiment 3 is the phosphor $CaSrSi_5N_8$: 0.5% europium (fine) having a mean grain size of $d_{50}$=4 μm. This fine-grained phosphor and the phosphor $CaSrSi_5N_8$: 0.5% europium (coarse) having a mean grain size of $d_{50}$=22 μm were subjected to a laser stress test (30 $W/mm^2$;409 nm). The fine-grained phosphor initially emits at $\lambda_{dom} \approx 597$ nm, and the coarse-grained phosphor at $\lambda_{dom} \approx 599$ nm. After 120 minutes of stress, the fine-grained phosphor lost 71% conversion efficiency, and the coarse-grained phosphor only 17%.

Figure 8:
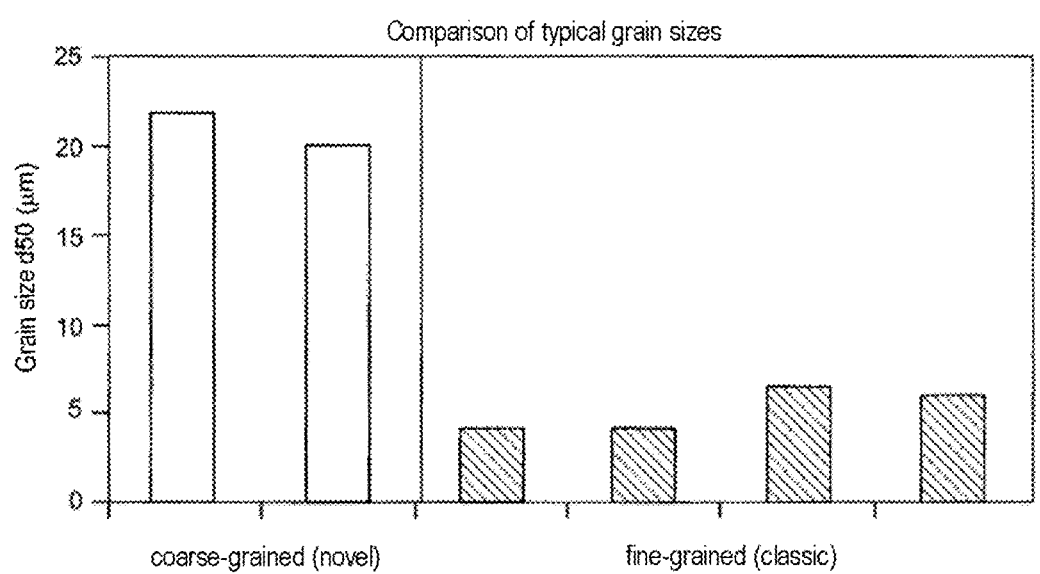
FIG. 8 shows a comparison of typical grain sizes of phosphors for the laser application.

FIG. 8 shows a comparison of typical grain sizes (each d50) of a similar phosphor M2Si5N8:Eu. For the laser application, the mean grain size should lie at 20 or 22 μm, for example, heretofore usually phosphors having mean grain size of significantly less than 10 μm were used, d50=5 μm is typical here.

Figure 9:
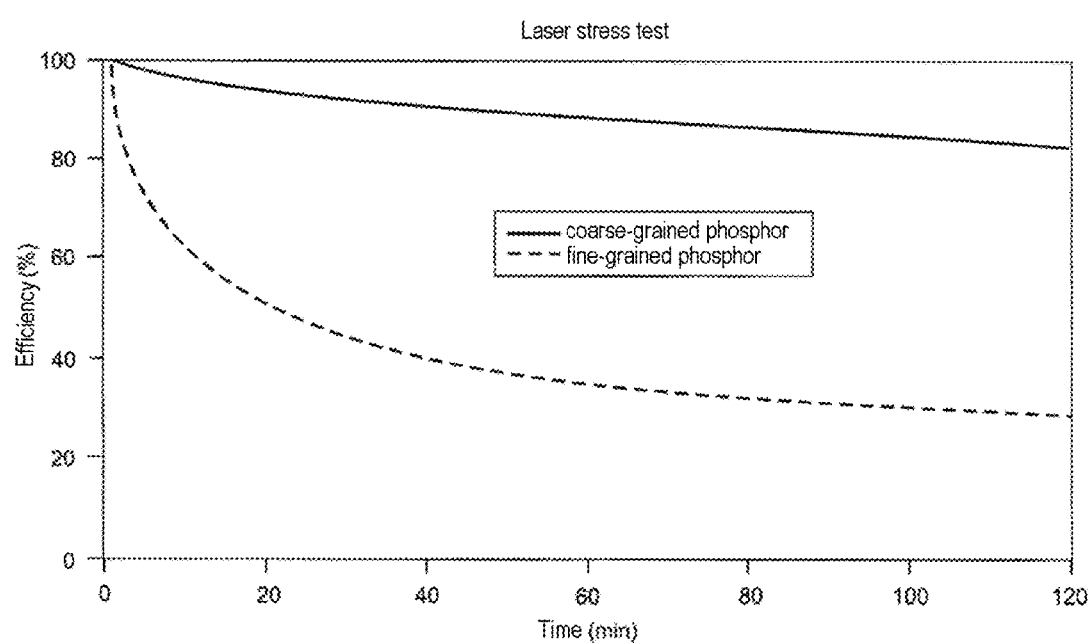
FIG. 9 shows a result of a laser stress test for various phosphors.

FIG. 9 shows the result of a laser stress test. In this case, the behaviors of coarse-grained and fine-grained phosphor M2Si5N8:Eu with d50=20 μm or 4 μm, respectively, were compared to one another. The abscissa is the time in minutes, the ordinate is the relative efficiency. The doping is of equal amount in each case, specifically 0.5 mol-% europium in relation to M. In this case, M=Ca0.5Sr0.5. The chemical composition is thus identical, the only difference is the mean grain size d50. It has been shown that the fine-grained phosphor withstands the stress test significantly worse than the coarse-grained variant.

Figure 10:
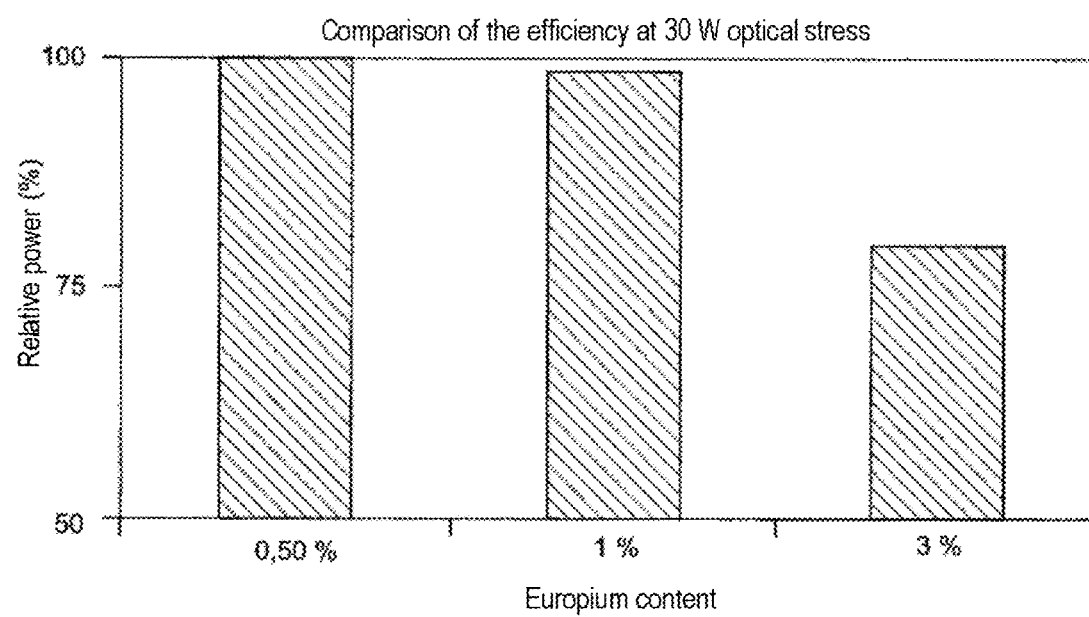
FIG. 10 shows a comparison of the efficiency of phosphors having different doping of europium.

FIG. 10 shows a comparison of the output power (in relation to sample 1, left column) of various phosphors having different degrees of doping of europium (0.5 to 3 mol-% in relation to M) in the case of an optical excitation using 30 W power. The lower the doping with the activator, the higher the stability. Sample 1 is CaSrSi5N8:Eu (0.5%), sample 2 (middle column) is CaSrSi5N8:Eu (1%), and sample 3 (right column) is Sr2Si5N8:Eu (3%). The stability decreases drastically between 1% and 3% as the concentration of the activator. An optimum range is between 0.3% and 1.7% europium, in particular 0.5% to 1.5% europium.

Figure 11:
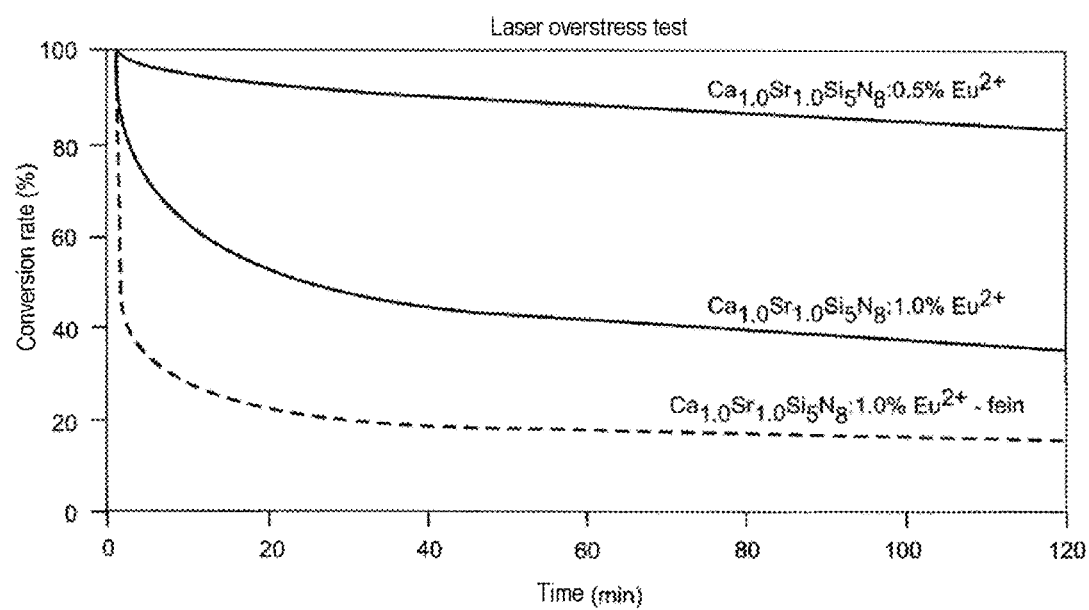
FIG. 11 shows a result of a laser overstress test for various phosphors.

FIG. 11 shows the result of a laser overstress test. The stress was approximately 30 $W/mm^2$ in each case. The samples have in principle similar composition. Coarse-grained phosphors (22 μm =d50) (solid lines) have significantly better resistance to overstress than fine-grained phosphors of the same type (dashed line).

Figure 12:
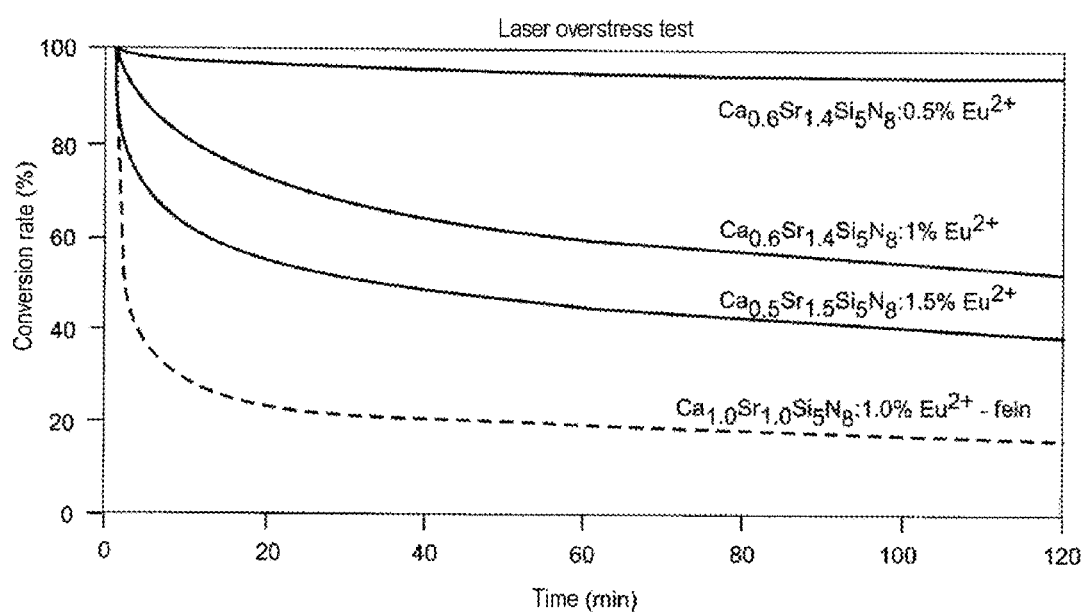
FIG. 12 shows a result of a laser overstress test for various phosphors having different diameters.

FIG. 12 shows a further result of a laser overstress test. The stress was approximately 30 $W/mm^2$ in each case. The samples have in principle similar composition. Coarse-grained phosphors (22 μm=d50) (solid lines) have significantly better resistance to overstress than fine-grained phosphors of the same type (dashed line).

Figure 13:
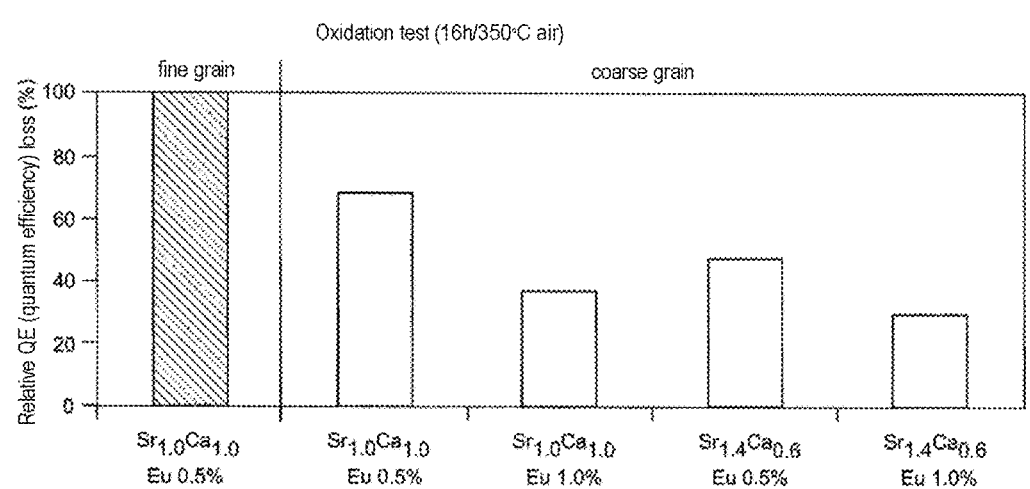
FIG. 13 shows a result of an oxidation test for various phosphors having different diameters.

FIG. 13 shows the result of an oxidation test over a period of time of 16 hours at 350° C. in air. The comparative example is a fine-grained phosphor (d50=4 μm), the relative quantum efficiency loss of which was set to 100%. This is SrCaSi5N8:Eu (0.5%). All coarse-grained phosphors, also having greater doping, lose significantly less efficiency. In relation to the fine-grained variant, the efficiency loss is only a fraction, specifically between 30 and 70%. Surprisingly, a higher resistance is displayed in this test in the case of coarse-grained phosphors having higher doping of the activator europium, specifically 1%, in comparison to lower doping of 0.5%.

In summary, it can be stated that in the case of phosphors of the type nitridosilicate, it has been surprisingly established that the stability under extreme application conditions can be decisively improved by careful selection of the grain size and in particular careful selection at the same time of the doping content, which should be selected to be less than 2 mol-%. In this case, not only the well-known europium, but rather other dopants such as cerium, manganese, or terbium, alone or optionally in combination, are suitable as the doping. The grain size should be at least d50=10 μm in this case, preferably at least 15 μm, particularly preferably at least 20 μm. It can be in particular in a range up to 30 μm.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A device for providing electromagnetic radiation, comprising:
    a radiation assembly for generating excitation radiation, and at least one conversion element for generating conversion radiation, which has at least one first phosphor and which is arranged at a distance to the radiation assembly in a beam path of the excitation radiation,
    wherein as the first phosphor, a nitridosilicate of the type $M_2Si_5N_8$:D is used, wherein D=activator and wherein M is selected from the group barium, strontium, calcium alone or in combination, wherein the mean grain size d50 of the phosphor is at least 10 μm;
    wherein the phosphor is a coarse-grained, low activator-doped phosphor.

2. The device as claimed in claim 1, wherein the mean grain size d50 is at least 15 μm.

3. The device as claimed in claim 1, wherein the concentration of activator D, in relation to M, is at most 2%.

4. The device as claimed in claim 3, wherein the concentration of activator is in the range of 0.1% to 1.5%.

5. The device as claimed in claim 1, wherein the activator contains europium.

6. The device as claimed in claim 1, wherein the conversion element is arranged movably in relation to the radiation assembly.

7. The device as claimed in claim 6, further comprising a phosphor wheel, which is arranged rotatably about an axis and which has the conversion element.

8. The device as claimed in claim 1, wherein the conversion element is arranged fixedly in relation to the radiation assembly.

9. The device as claimed in claim 1, wherein a surface of the conversion element has a cooling structure.

10. The device as claimed in claim 1, wherein the radiation assembly has at least one radiation source, which generates the excitation radiation having a high luminance.

11. The device as claimed in claim 10, wherein the radiation source is a laser, a laser diode, or a superluminescent diode.

12. The device as claimed in claim 11, in which the high luminance is between 1 $W/mm^2$ and 50 $W/mm^2$.

13. The device as claimed in claim 10, in which the high luminance is between 1 $W/mm^2$ and 50 $W/mm^2$.

14. The device as claimed in claim 1, wherein the mean grain size d50 is at least 20 μm.

15. The device as claimed in claim 1, wherein the phosphor of the conversion element is embedded in a matrix material.

16. The device as claimed in claim 15, wherein the matrix material has a condensed metal phosphate.

17. The device as claimed in claim 16, wherein a thermal coefficient of expansion of the conversion layer having the matrix material made of the condensed metal phosphate and having the phosphor is greater than $5.0 \times 10^{-6}$ $K^{-1}$.

18. The device as claimed in claim 1, wherein the conversion element is not in direct physical contact with the radiation assembly and said distance is greater than zero.

* * * * *